United States Patent
Lin et al.

(10) Patent No.: US 7,975,848 B2
(45) Date of Patent: Jul. 12, 2011

(54) CONTAINER AND LINER THEREOF

(75) Inventors: Chih-Ming Lin, Shulin (TW); Ming-Chien Chiu, Shulin (TW)

(73) Assignee: Gudeng Precision Industrial Co, Ltd, Shulin (TW)

( * ) Notice: Subject to any disclaimer, the term of this patent is extended or adjusted under 35 U.S.C. 154(b) by 295 days.

(21) Appl. No.: 12/187,491

(22) Filed: Aug. 7, 2008

(65) Prior Publication Data

US 2009/0038988 A1 Feb. 12, 2009

(30) Foreign Application Priority Data

Aug. 10, 2007 (TW) .............................. 96213180 U

(51) Int. Cl.
*B65D 85/48* (2006.01)
(52) U.S. Cl. ........................ 206/454; 206/710
(58) Field of Classification Search .................. 206/449, 206/454–456, 710; 220/476, 480, 481, 483
See application file for complete search history.

(56) References Cited

U.S. PATENT DOCUMENTS

| | | | |
|---|---|---|---|
| 1,549,995 A * | 8/1925 | Knappmeier | 220/476 |
| 4,314,897 A * | 2/1982 | Monte et al. | 206/449 |
| 5,405,043 A * | 4/1995 | Meloney | 220/481 |
| 6,247,599 B1 | 6/2001 | Cheng et al. | |
| 6,338,409 B1 * | 1/2002 | Neary | 206/710 |
| 6,513,654 B2 | 2/2003 | Smith et al. | |
| 6,862,817 B1 | 3/2005 | Lenox | |
| 6,948,619 B2 | 9/2005 | Su et al. | |
| 7,065,894 B2 | 6/2006 | Lenox | |
| 7,125,755 B2 | 10/2006 | Kuo | |
| 7,159,719 B2 | 1/2007 | Golda | |
| 7,469,788 B2 * | 12/2008 | Chiu et al. | 206/710 |

* cited by examiner

*Primary Examiner* — Luan K Bui
(74) *Attorney, Agent, or Firm* — Ming Chow; Sinorica, LLC

(57) ABSTRACT

A container having a top cover and a bottom cover is provided, which includes a canopy disposed on the bottom cover to form therewith a space to accommodate an article. A plurality of locators is disposed on a surface of the bottom cover so that when the bottom cover is tightly combined with the top cover, the locators are clipped between the bottom cover and the top cover to orient the canopy in a fixed position.

7 Claims, 4 Drawing Sheets

CONTAINER AND LINER THEREOF

BACKGROUND OF THE INVENTION

1. Field of the Invention

The present invention relates to a container and, more particularly, to a canopy in a container and a method of orienting the canopy in a fixed position.

2. Description of the Prior Art

Semiconductor technologies have developed rapidly in the past few decades, wherein optical lithography plays a critical role. Optical lithography is depended upon wherever a pattern needs to be defined.

When optical lithography is applied to semiconductors, a designed pattern is first made into a light-transmitting reticle having a particular shape. Then, a light source is projected through the reticle onto a silicon wafer to reveal a particular pattern by exposure. The reticle used for generating a pattern must be clean absolutely because any particles attached to the reticle (such as particles, powder dusts, or organic matters) will impair the quality of imaging through projection. Therefore, a clean room is always necessary for general wafer processes to prevent contamination by airborne particles. However, the clean rooms nowadays can not achieve an absolutely dust-free standard. Anti-contamination reticle pods are hence used in modern semiconductor processes for storing and transporting reticles in order to maintain the reticle cleaning process.

A conventional reticle pod is usually made of a macromolecular material. This kind of material provides such advantages as molding easily, low cost, and transparent. While this kind of material has a high electric resistance and is therefore nonconductive, it tends to generate static electricity from friction or general handling. Particularly in a clean room where humidity must be kept at a low level, electric charge can be very easily generated and accumulated on the reticle made of such material. Electrostatic charge on a surface of a reticle will attract particulate pollutants in the air or even result in an electrostatic discharge (ESD) from metal lines on the reticle. Once the static electricity discharge, a transient current is generated and may produce sparks or arcs. A strong current and a high temperature accompanying the sparks or arcs will eventually oxidize and melt the metal lines, thereby changing the pattern on the reticle.

Presently there are many solutions to the problems associated with electrostatic discharge. First of all is to improve the working environment, such as maintaining an appropriate humidity in the air, equipping operators with clothes having a grounding effect, or using ion fans to remove static electricity in the environment. However, the working environment may be changed by a plurality of unpredictable factors, so that it is impossible to completely prevent a reticle from being damaged by static electricity.

Another approach is to change the material of the reticle pod. For example, U.S. Pat. No. 6,513,654 disclosed a reticle support structure with a grounding function, in which the reticle support structure can release electrostatic charge on a reticle when a reticle pod is in contact with a matching table. As another example, U.S. Pat. No. 6,247,599 disclosed a conductive plate is disposed on the chassis or canopy of a reticle pod to reduce the accumulation of electric charge. While the method of adding an electrically conductive chassis has been widely adopted, the canopy and the chassis are positioned mainly by screws, which becomes a contamination source during a screwing process because the friction in the screwing process will generate particles and thus causes the contamination.

In view of the above, the present invention aims to improve the shortcomings of prior art reticle pods by providing a reticle pod disclosed herein.

SUMMARY OF THE INVENTION

A primary objective of the present invention is to provide a container and a canopy thereof, wherein the canopy is positioned without using screws to prevent the particle from being generated and thereby reduce the contamination.

A second objective of the present invention is to provide a container and a canopy thereof for preventing electric charge from accumulating and thereby protecting a reticle from being damaged by static electricity.

A third objective of the present invention is to provide a canopy in a container, and the canopy can be disposed in the container without changing an original structure of the container.

To achieve these ends, the present invention provides a container comprising a top cover and a bottom cover. The container further has a canopy disposed on the bottom cover for forming therewith a space to accommodate an article. A plurality of locators is mounted around the periphery of the canopy, so that when the bottom cover is tightly combined with the top cover, the plurality of locators is sandwiched in between the bottom cover and the top cover to orient the canopy in a fixed position.

The present invention also provides a container that having a top cover and a bottom cover, in which a wall is disposed on the surface that facing the top cover. The container further includes a canopy that disposed on the bottom cover for forming therewith a space to accommodate an article. A plurality of locators pressed against the wall and is mounted around the periphery of the canopy to orient the canopy in a fixed position.

The present invention further provides a container having a top cover and a bottom cover, and the top cover and the bottom cover constructed an internal space therein. The container further includes a chassis that disposed on a surface of the bottom cover facing the internal space while at least a wall is disposed on the surface thereof facing the internal space. The container also includes a canopy disposed on the chassis for forming therewith a space to accommodate an article. A plurality of locators pressed against the wall and is mounted around the periphery of the canopy to orient the canopy in a fixed position.

The present invention further provides a canopy for being disposed in a container, in which the container includes a top cover and a bottom cover, and at least a wall disposed on the surface of the bottom cover that facing the top cover. A plurality of locators pressed against the wall on the bottom cover and is mounted around the periphery of the canopy to orient the canopy in a fixed position.

The present invention further provides a canopy for being disposed in a container, in which the container includes a top cover and a bottom cover, and a chassis is disposed on the surface of the bottom cover facing the top cover, in which a wall is disposed on the surface of the chassis facing the top cover. A plurality of locators to press against the wall on the chassis is mounted on the around of the canopy to orient the canopy in a fixed position.

In summary, the present invention provides a novel design that is not only serves to orient a canopy in a fixed position without using screws, but also prevent the particles from being generated and thereby reduce the contamination. The canopy made of an electrically conductive material, which can protect an article that stored therein from being damaged by static electricity. Moreover, the present invention can be applied to the reticle pods nowadays without changing the original designs of the reticle pods.

BRIEF DESCRIPTION OF THE DRAWINGS

The invention as well as a preferred mode of use, further objectives and advantages thereof will best be understood by reference to the following detailed description of illustrative embodiments when read in conjunction with the accompanying drawings, wherein.

DETAILED DESCRIPTION OF THE PREFERRED EMBODIMENT

While the present invention is described below as applied to a container for use with semiconductors, the scope of the present invention encompasses all the applications where cleanness and a sealed condition are required, such as the medical and therapeutic equipments, biochemical devices or optical instruments. In addition, in the present invention the basic components as well as their structures and the mechanic principles involved that can be readily understood by a person of ordinary skill in the pertinent art will not be further explained herein. Moreover, the drawings referred to below are intended to demonstrate only schematically structures related to features of the present invention. The drawings are therefore not, and unnecessary to be, drawn according to actual dimensions.

Figure 1A:
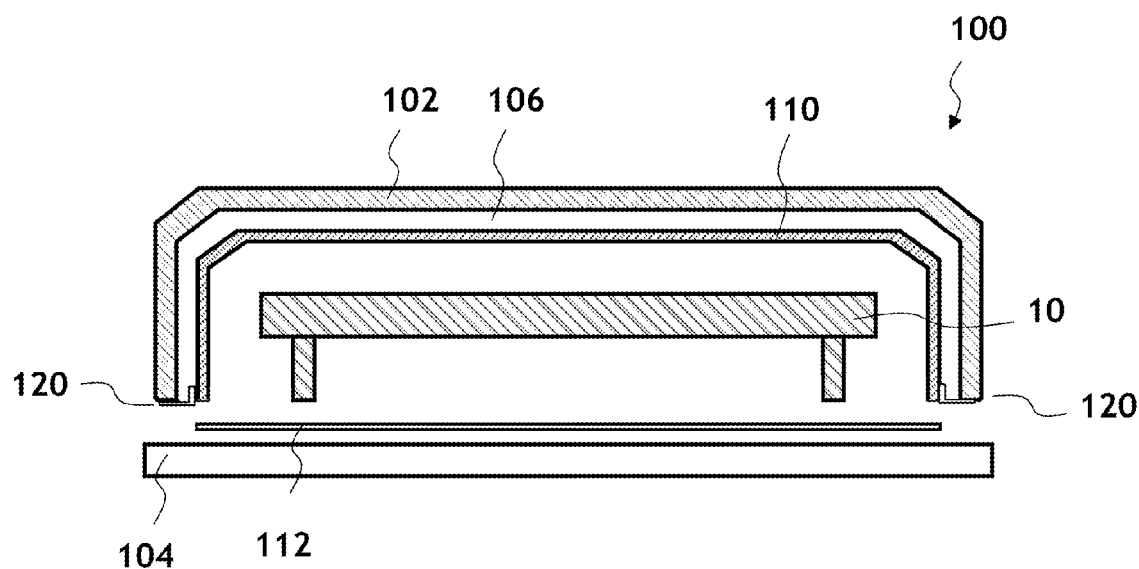
FIG. 1A is a cross-sectional exploded view of a container according to a first preferred embodiment of the present invention.
Figure 1B:
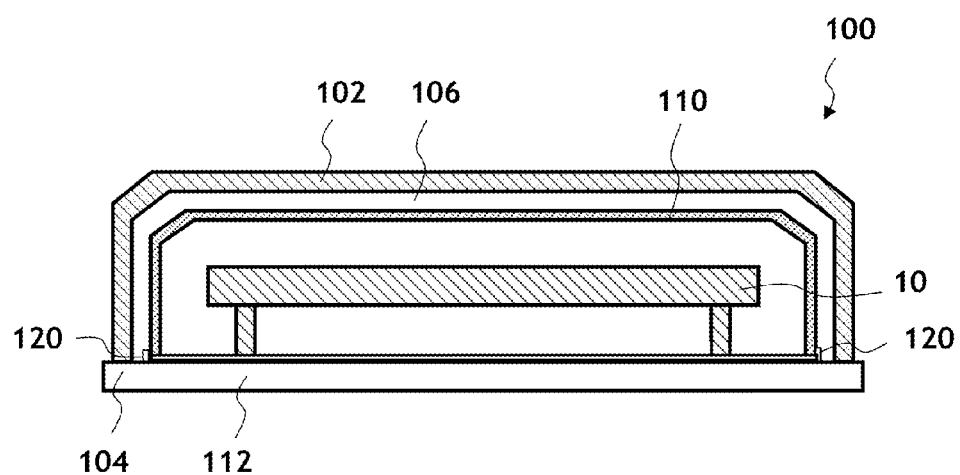
FIG. 1B is a cross-sectional assembled view of the container according to the first preferred embodiment of the present invention.

According to a first embodiment of the present invention, FIGS. 1A and 1B illustrate a container 100 for storing or transporting an article, such as a reticle pod or a single-reticle SMIF-pod for use with semiconductors. The container 100 includes a top cover 102 and a bottom cover 104, and the top cover 102 and the bottom cover 104 constructed an internal space 106 therein. In this embodiment, the container 100 is reticle pod. The container 100 further includes a canopy 110 disposed on the bottom cover 104, so that the canopy 110 and the bottom cover 104 constructed a space to accommodate a reticle 10.

A plurality of locators 120 is disposed around the periphery of the canopy 110, and the plurality of locators 120 can be mounted on the canopy 110 by riveting, welding or screwing. The shaped of locator 120 is L-shaped and usually mounted at four corners of the canopy 110. When the top cover 102 is tightly combined with the bottom cover 104, the ends of each said L-shaped locators 120 will be sandwiched in between the bottom cover 104 and the top cover 102 to orient the canopy 110 in a fixed position. Therefore, the canopy 110 would not be moved during the container 100 is conveyed.

The bottom cover 104 can further include a chassis 112 on its surface and face toward the internal space 106, so that a shielding effect can against the static electricity when the top cover 110 and/or the chassis 112 are made of a metal or other electrically conductive materials.

Figure 2:
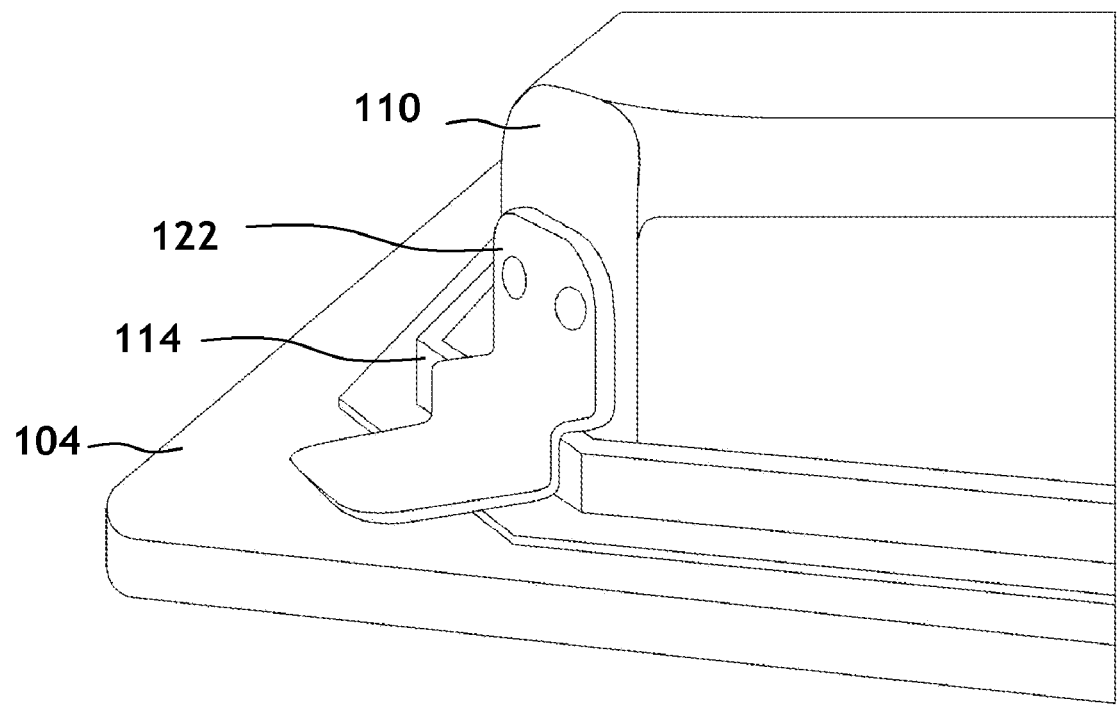
FIG. 2 is a perspective structural drawing of a locator according to a second preferred embodiment of the present invention.

According to a second preferred embodiment of the present invention, as shown in FIG. 2, the bottom cover 104 includes at least one wall 114 disposed on the surface of the bottom cover 104 that facing the internal space 106, while the canopy 110 includes a plurality of locators 122 mounted on the periphery of the canopy 110. The shaped of each the locators 122 are substantially L-shaped and a bent portion is located at the corner of the L-shaped locators 122 for pressing against the wall 114 to orient the canopy 110 in a fixed position. When all the locators 122 pressed against the wall 114, the range of horizontal movement of the canopy 110 is restricted, so that the canopy 110 would not be tilted or moved during the container 100 is conveyed.

Alternatively, the wall 114 can be disposed on the surface of the chassis 112 and faced toward the internal space 106. The bent portions at the corners of the L-shaped locators 122 are used to press against the wall 114 to orient the canopy 110 in a fixed position.

Figure 3A:
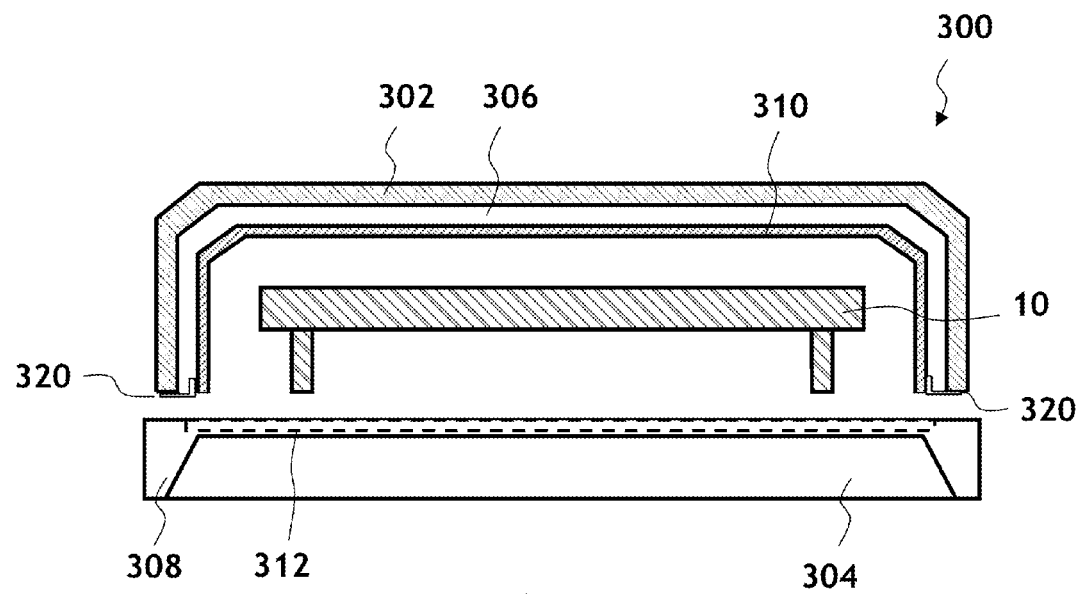
FIG. 3A is a cross-sectional assembled view of a container according to a third preferred embodiment of the present invention.
Figure 3B:
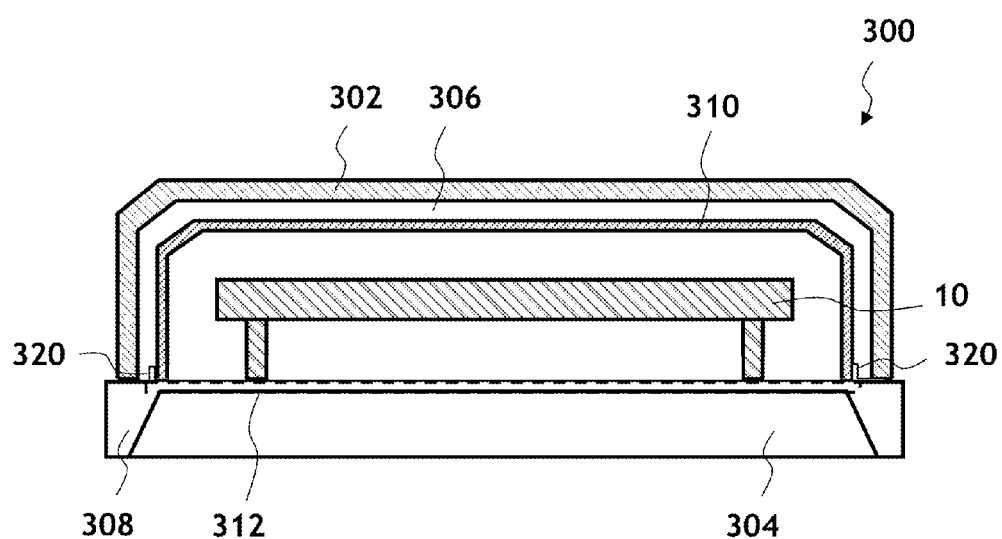
FIG. 3B is a cross-sectional exploded view of the container according to the third preferred embodiment of the present invention.

Referring to FIGS. 3A and 3B, a container 300 for storing or transporting an article according to a third preferred embodiment. The reticle pod includes a top cover 302 that having a first opening, a frame 308 disposed at the rim of the first opening, and a bottom cover 304 engaged with the frame 308. The top cover 302, the frame 308 and the bottom cover 304 enclosed an internal space 306 therein. The container 300 also includes a canopy 310 that disposed in the internal space 306 and enclosed the space with the bottom cover 304 to accommodate the reticle 10.

The canopy 310 includes a plurality of locators 320, which can be mounted on the canopy 310 by riveting, welding, or screwing. The locators 320 are substantially L-shaped and usually mounted at four corners of the canopy 310. When the top cover 302 is tightly combined with the frame 308, an end of each said L-shaped locators 320 is sandwiched in between the frame 308 and the top cover 302 to orient the canopy 310 in a fixed position. Therefore, the canopy 310 would not be moved during the container 300 is conveyed.

The bottom cover 304 includes a chassis 312 that disposed on the surface of the bottom cover 304 and faced the internal space 306, so that a shielding effect against the static electricity can be provided when the top cover 310 and/or the chassis 312 are/is made of a metal or other electrically conductive materials.

Figure 4A:
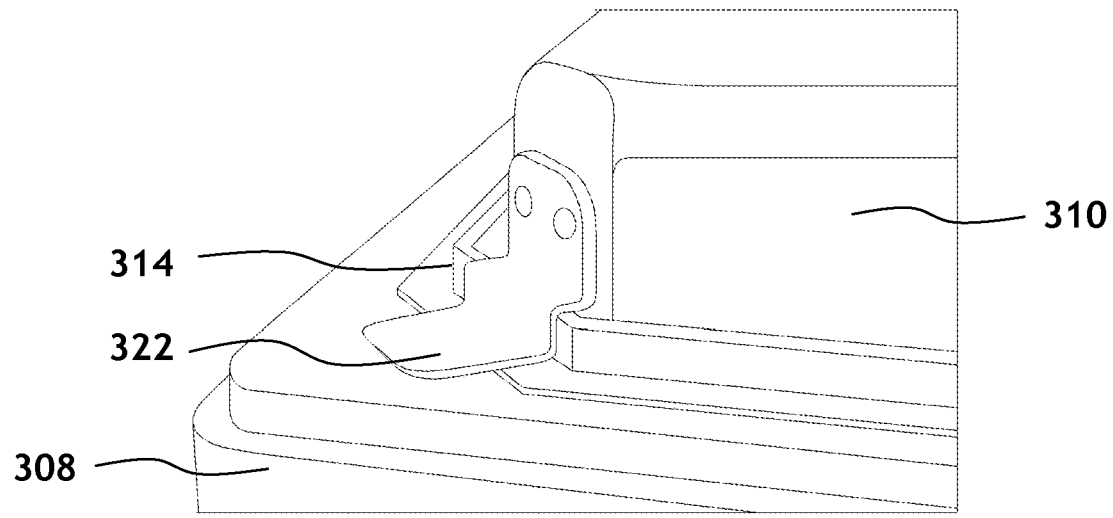
FIG. 4A is a perspective structural drawing of a locator according to a fourth preferred embodiment of the present invention.
Figure 4B:
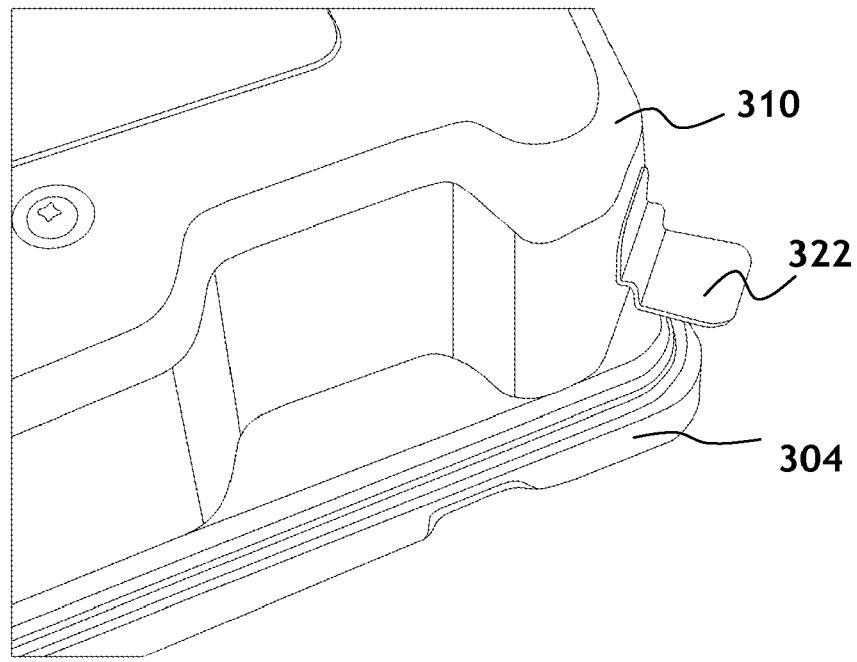
FIG. 4B is another perspective structural drawing of the locator according to the fourth preferred embodiment of the present invention.

According to a fourth preferred embodiment of the present invention, as shown in FIGS. 4A and 4B. The frame 308 includes at least one wall 314 that disposed on its surface faced toward the internal space 306. The canopy 310 is equipped with a plurality of locators 322 that mounted around the periphery of the canopy 310. Each the plurality of locators 322 is L-shaped and a bent portion is located at a corner of the L-shape for pressing against the wall 314 to orient the canopy 310 in a fixed position. When the plurality of locators 322 pressed against the wall 314, the range of horizontal movement of the canopy 310 is restricted, so that the canopy 310 would not be tilted or moved during the container is conveyed.

Alternatively, the wall 314 can be mounted on the surface of the bottom cover 304 and faced toward the internal space

306. The bent portions at the corners of the L-shaped locators 322 are used to press against this wall 314 to orient the canopy 310 in a fixed position.

The present invention has been described with preferred embodiments thereof and it is understood that the embodiments are not intended to limit the scope of the present invention. Moreover, as the content disclosed herein should be readily understood and can be implemented by a person skilled in the art, all equivalent changes or modifications which do not depart from the spirit of the present invention are encompassed by the appended claims.

What is claimed is:

1. A container for storing or transporting an article, comprises:
    a top cover;
    a bottom cover, forming an internal space with the top cover and having at least one wall disposed on the surface of the bottom cover;
    a canopy, disposed in the internal space and on the bottom cover, and the canopy and the bottom cover constructed a space to accommodate the reticle; and
    a plurality of locators, mounted around the outer periphery of the canopy, when the top cover is tightly combined with the bottom cover, the plurality of locators are disposed sandwiched in between the bottom cover and the top cover and pressed against the wall to orient the canopy in a fixed position.

2. The container according to claim 1, further comprising a chassis disposed on a surface of the bottom cover and faced toward the internal space.

3. The container according to claim 2, wherein the chassis is made of an electrically conductive material.

4. The container according to claim 1, wherein each the locators is L-shaped.

5. The container according to claim 4, wherein each said L-shaped locators has a first end mounted on the canopy and a second end sandwiched in between the top cover and the bottom cover.

6. The container according to claim 1, wherein the canopy is made of an electrically conductive material.

7. The container according to claim 1, wherein the container is used in the Standard Mechanical Interface system.

* * * * *